(12) United States Patent
Gotou

(10) Patent No.: US 9,607,884 B2
(45) Date of Patent: Mar. 28, 2017

(54) SEMICONDUCTOR DEVICE AND METHOD OF MANUFACTURING THE SAME

(71) Applicant: RENESAS ELECTRONICS CORPORATION, Tokyo (JP)

(72) Inventor: Takayuki Gotou, Yamagata (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/975,518

(22) Filed: Dec. 18, 2015

(65) Prior Publication Data

US 2016/0104636 A1    Apr. 14, 2016

Related U.S. Application Data

(62) Division of application No. 14/017,953, filed on Sep. 4, 2013, now Pat. No. 9,337,081.

(30) Foreign Application Priority Data

Sep. 5, 2012   (JP) ................................. 2012-194706

(51) Int. Cl.
   *H01L 21/00*   (2006.01)
   *H01L 21/76*   (2006.01)
   (Continued)

(52) U.S. Cl.
   CPC .... *H01L 21/76802* (2013.01); *H01L 21/0217* (2013.01); *H01L 21/02126* (2013.01);
   (Continued)

(58) Field of Classification Search
   CPC ..... H01L 21/768; H01L 23/498; H01L 21/00; H01L 21/02; H01L 21/76; H01L 21/311;
   (Continued)

(56) References Cited

U.S. PATENT DOCUMENTS 6,153,511 A    11/2000   Watatani
7,799,693 B2    9/2010   Soda
          (Continued)

FOREIGN PATENT DOCUMENTS

JP    2000-124306 A    4/2000
JP    2003-309174 A    10/2003
          (Continued)

OTHER PUBLICATIONS

Notification of Reasons for Refusal, issued in corresponding Japanese Patent Application No. 2012-194706, mailed on Nov. 4, 2015; with English translation.
(Continued)

*Primary Examiner* — Chuong A Luu
(74) *Attorney, Agent, or Firm* — McDermott Will & Emery LLP

(57) ABSTRACT

Manufacturing stability of a semiconductor device is improved. A method of manufacturing a semiconductor device includes the steps of: forming an etching stopper film over a first interlayer insulating film; forming an inorganic insulating film over the etching stopper film; forming a resist film over the inorganic insulating film; selectively etching the etching stopper film and the inorganic insulating film by using the resist film as a mask to form a first opening in the etching stopper film and to form a second opening in the inorganic insulating film; removing the resist film by $O_2$ plasma ashing; forming a second interlayer insulating film over the inorganic insulating film; and etching the second interlayer insulating film to form a wiring groove that is coupled to the second opening, and etching a portion located under the first opening of the first interlayer insulating film to form a via hole.

6 Claims, 6 Drawing Sheets

(51) Int. Cl.
  *H01L 21/768* (2006.01)
  *H01L 23/498* (2006.01)
  *H01L 23/532* (2006.01)
  *H01L 21/02* (2006.01)
  *H01L 21/311* (2006.01)

(52) U.S. Cl.
  CPC .. *H01L 21/02164* (2013.01); *H01L 21/02167* (2013.01); *H01L 21/31144* (2013.01); *H01L 21/7681* (2013.01); *H01L 21/76832* (2013.01); *H01L 21/76877* (2013.01); *H01L 23/49827* (2013.01); *H01L 23/53295* (2013.01); *H01L 2924/0002* (2013.01)

(58) Field of Classification Search
  CPC ........... H01L 21/76802; H01L 21/0217; H01L 21/02167; H01L 21/02164; H01L 21/02126; H01L 21/76224; H01L 21/76232; H01L 21/76229; H01L 21/762235; H01L 21/6784; H01L 21/76829
  USPC ....... 438/618, 638, 667, 637, 640, 622, 424, 438/427, 435, 436, 438, 624, 634
  See application file for complete search history.

(56) References Cited

U.S. PATENT DOCUMENTS

| | | | |
|---|---|---|---|
| 8,486,836 | B2 | 7/2013 | Oshida et al. |
| 2003/0153176 | A1 | 8/2003 | Karakawa |
| 2003/0209738 | A1* | 11/2003 | Ohto ................ H01L 21/32136 257/257 |
| 2005/0020057 | A1 | 1/2005 | Kudo et al. |
| 2009/0014887 | A1 | 1/2009 | Ohtake et al. |
| 2010/0043821 | A1* | 2/2010 | Li ........................ G03F 7/427 134/1.2 |
| 2010/0178771 | A1* | 7/2010 | Oh .................... H01L 21/31144 438/700 |
| 2011/0318900 | A1 | 12/2011 | Oshida et al. |

FOREIGN PATENT DOCUMENTS

| | | |
|---|---|---|
| JP | 2004-311477 A | 11/2004 |
| JP | 2006-502586 A | 1/2006 |
| JP | 2006-041039 A | 2/2006 |
| JP | 2007-123529 A | 5/2007 |
| JP | 2007-227958 A | 9/2007 |
| JP | 2007-281197 A | 10/2007 |
| JP | 2007-305755 A | 11/2007 |
| WO | 2004/033752 A2 | 4/2004 |
| WO | 2007/078011 A1 | 7/2007 |

OTHER PUBLICATIONS

Non-Final Office Action issued in U.S. Appl. No. 14/017,953, mailed on Mar. 16, 2015.
Final Office Action issued in U.S. Appl. No. 14/017,953, mailed on Jul. 17, 2015.
Notice of Allowance issued in U.S. Appl. No. 14/017,953, mailed on Sep. 18, 2015.
Notification of Reasons for Refusal, issued in corresponding Japanese Patent Application No. 2012-194706, mailed on May 24, 2016; with English translation.

* cited by examiner

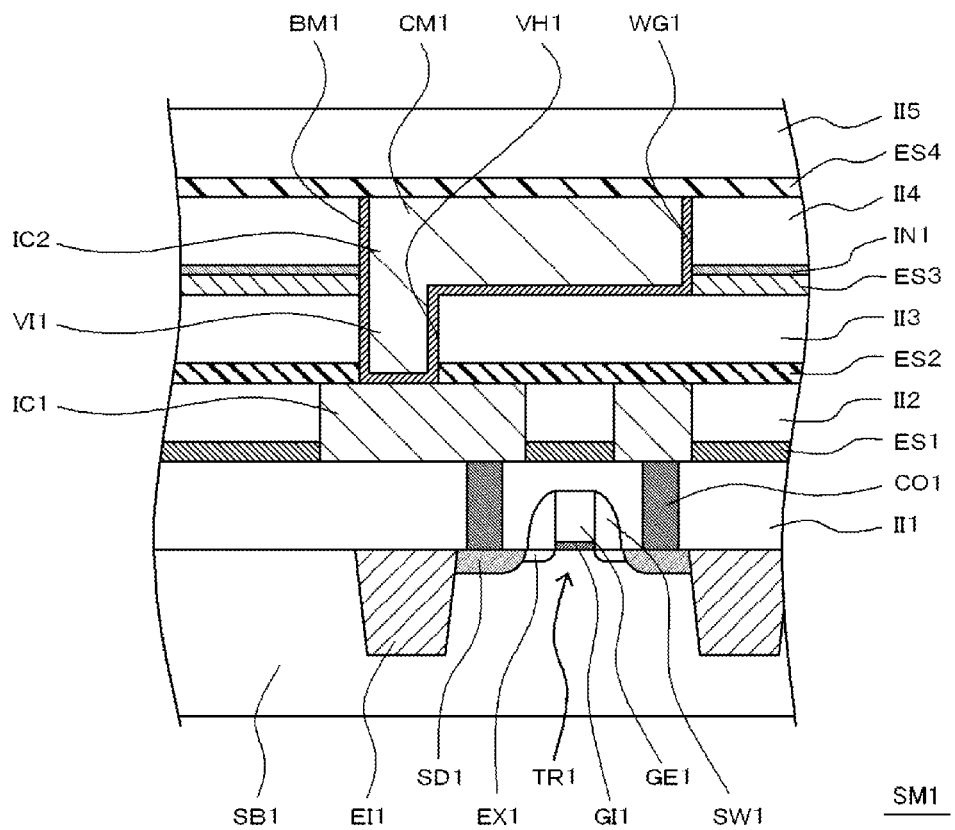

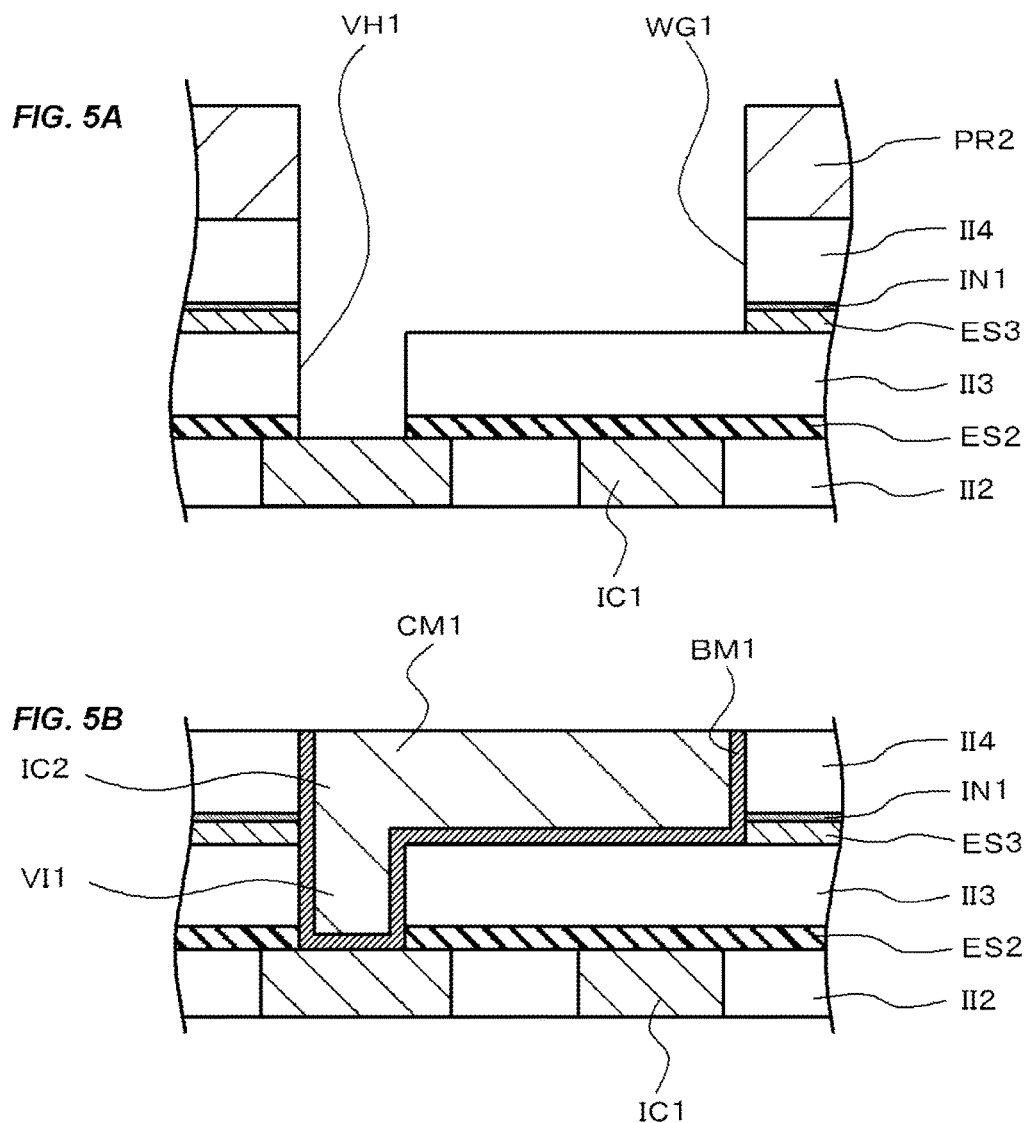

SEMICONDUCTOR DEVICE AND METHOD OF MANUFACTURING THE SAME

CROSS-REFERENCE TO RELATED APPLICATION

This application is a Divisional of U.S. patent application Ser. No. 14/017,953, filed on Sep. 4, 2013, now U.S. Pat. No. 9,337,081, which in turn claims the benefits of Japanese Patent Application No. 2012-194706 filed on Sep. 5, 2012, the disclosure of which is incorporated by reference in its entirety.

BACKGROUND

The present invention relates to a semiconductor device and a method of manufacturing the same, and it is, for example, a technology applicable to a semiconductor device having a damascene wiring and a method of manufacturing the semiconductor device.

Various technologies related to wirings that configure a semiconductor device have been examined, and they include, for example, technologies described in International Publication No. WO 2007/078011 (Patent Document 1), Japanese Patent Laid-Open No. 2004-311477 (Patent Document 2), Japanese Patent Laid-Open No. 2007-123529 (Patent Document 3), Japanese Patent Laid-Open No. 2007-227958 (Patent Document 4), Japanese Patent Laid-Open No. 2007-281197 (Patent Document 5), Japanese Patent Laid-Open No. 2006-41039 (Patent Document 6), and Japanese Patent Laid-Open No. 2007-305755 (Patent Document 7). The technology described in Patent Document 1, after forming a via hole pattern in an insulating film structure, forms a groove pattern in a hard mask film, and performs groove processing in the above-described insulating film structure using the hard mask film as a mask. The technology described in Patent Document 2 is the one in which a mask for forming a wiring groove and a connection hole of a bottom of the wiring groove has a three-layer structure.

The technology described in Patent Document 3 couples divided trenches to each other by a via hole. The technology described in Patent Document 4 is the one in which a silicon-containing metal wiring that does not include a metal silicide layer is used as a metal wiring. The technology described in Patent Document 5 removes an interlayer insulating film serving as a mask in forming a wiring layer and forms a via hole over the wiring layer. The technology described in Patent Document 6 removes a part of an insulating film to make a via hole penetrate by dry etching in which a mixed gas containing a fluorine compound gas and a nitrogen-containing gas is used for an etching gas, and in which a pressure of the mixed gas in an etching treatment chamber is controlled in a range of 0.1 Pa to 6.0 Pa. In addition, the technology described in Patent Document 7 forms a hydrophobic first insulating film and a hydrophilic second insulating film as insulating films that configure a multilayer wiring structure.

SUMMARY

There is a middle-first dual damascene method as one of methods of forming a damascene wiring. In the middle-first dual damascene method, after an etching stopper film is formed over a first interlayer insulating film, the etching stopper film is patterned. Next, a second interlayer insulating film is formed over the etching stopper film. Next, the first interlayer insulating film is etched to form a via hole, while the second interlayer insulating film is etched to form a wiring groove. At this time, the etching stopper film functions as an etching stopper when the second interlayer insulating film is etched, and functions as a hard mask when the first interlayer insulating film is etched.

In the middle-first dual damascene method, the above-described etching stopper film is patterned using, for example, a resist film as a mask. However, the above-described etching stopper film might be damaged when the resist film is removed by ashing treatment. In this case, there is a possibility that a function as the etching stopper in the above-described etching stopper film is impaired, and that manufacturing stability of a semiconductor device is deteriorated. The other problems and the new feature will become clear from the description of the present specification and the accompanying drawings.

According to one embodiment, an inorganic insulating film not containing C is formed over an etching stopper film containing Si and C.

According to the one embodiment, manufacturing stability of a semiconductor device can be improved.

BRIEF DESCRIPTION OF THE DRAWINGS

FIG. 1 is a cross-sectional view showing a semiconductor device according to the present embodiment;

FIGS. 5A and 5B are cross-sectional views showing the method of manufacturing the semiconductor device shown in FIG. 1.

DETAILED DESCRIPTION

Figure 2A:
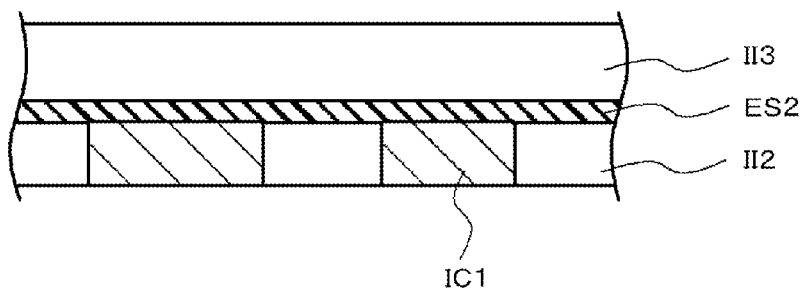
FIGS. 2A and 2B are cross-sectional views showing a method of manufacturing the semiconductor device shown in FIG. 1.

Hereinafter, an embodiment of the present invention will be explained using drawings. Note that in all the drawings, a similar symbol is attached to a similar component, and explanation thereof is appropriately omitted.

FIG. 1 is a cross-sectional view showing a semiconductor device SM1 according to the present embodiment. It is to be noted that FIG. 1 is a schematic view showing the semiconductor device SM1, and that a configuration of the semiconductor device SM1 is not limited to the one shown in FIG. 1. As shown in FIG. 1, the semiconductor device SM1 includes: a semiconductor substrate SB1; an interlayer insulating film II3; a via plug VI1; an etching stopper film ES3; an inorganic insulating film IN1; an interlayer insulating film II4; and a wiring IC2.

The interlayer insulating film II3 is provided over the semiconductor substrate SB1. The via plug VI1 is formed in the interlayer insulating film II3 so as to penetrate it. The etching stopper film ES3 is provided over the interlayer insulating film II3. In addition, the etching stopper film ES3 contains Si and C. The inorganic insulating film IN1 is provided over the etching stopper film ES3. In addition, the inorganic insulating film IN1 does not contain C. The interlayer insulating film II4 is provided over the inorganic insulating film IN1. In addition, the interlayer insulating film II4 has a thickness not less than ten times a thickness of the inorganic insulating film IN1. The wiring IC2 is formed in the interlayer insulating film II3 so as to penetrate it. In addition, the wiring IC2 is coupled to the via plug VI1. Hereinafter, a configuration of the semiconductor device SM1 will be explained in detail.

For example, a transistor TR1 is provided at the semiconductor substrate SB1. The transistor TR1 is electrically isolated from other transistors, for example, by an element isolating film EI1 provided at the semiconductor substrate SB1. As shown in FIG. 1, the transistor TR1 includes: a gate electrode GE1; a gate insulating film GI1; a source/drain region SD1; an extension region EX1; and a sidewall SW1. The semiconductor substrate SB1 is, for example, a silicon substrate.

The gate insulating film GI1 is provided over the semiconductor substrate SB1. The gate insulating film GI1, for example, includes $SiO_2$. The gate electrode GE1 is provided over the gate insulating film GI1. The gate electrode GE1, for example, includes a polycrystalline Si film. The sidewall SW1 is provided over a side surface of the gate electrode GE1 and the gate insulating film GI1. The sidewall SW1, for example, includes a silicon oxide film or a silicon nitride film. The source/drain region SD1 is provided at the semiconductor substrate SB1 so as to be located on both sides of the gate electrode GE1. The extension region EX1 is provided at the semiconductor substrate SB1 so as to be located between the source/drain region SD1 and the gate electrode GE1 in a planar view.

An interlayer insulating film II1 is provided over the semiconductor substrate SB1. The interlayer insulating film II1 is provided all over the semiconductor substrate SB1, for example, so as to cover the transistor TR1. The interlayer insulating film II1, for example, includes $SiO_2$ or SiOF. In addition, the interlayer insulating film II1 may include a low-dielectric-constant film. A contact plug CO1 coupled to the source/drain region SD1 is buried in the interlayer insulating film II1. The contact plug CO1, for example, includes W.

An etching stopper film ES1 is formed over the interlayer insulating film II1. The etching stopper film ES1 is provided all over the interlayer insulating film II1, for example, so as to cover the contact plug CO1. The etching stopper film ES1, for example, includes SiCN or SiC. An interlayer insulating film II2 is formed over the etching stopper film ES1. The interlayer insulating film II2, for example, includes $SiO_2$ or SiOF. In addition, the interlayer insulating film II2 may include a low-dielectric-constant film. In the present embodiment, the etching stopper film ES1 functions as an etching stopper when the interlayer insulating film II2 is etched. A wiring IC1 is buried in the etching stopper film ES1 and the interlayer insulating film II2 so as to penetrate them. The wiring IC1 is coupled to the source/drain region SD1 through the contact plug CO1.

An etching stopper film ES2 is formed over the interlayer insulating film II2. The etching stopper film ES2 is provided all over the interlayer insulating film II2, for example, so as to cover the wiring IC1. The etching stopper film ES2, for example, includes SiCN or SiC. The interlayer insulating film II3 is formed over the etching stopper film ES2. The interlayer insulating film II3, for example, includes $SiO_2$ or SiOF. In addition, the interlayer insulating film II3 may include a low-dielectric-constant film. In the present embodiment, the etching stopper film ES2 functions as an etching stopper when the interlayer insulating film II3 is etched.

The via plug VI1 is formed in the interlayer insulating film II3 so as to penetrate it. In the present embodiment, the via plug VI1 is, for example, provided so as to penetrate the interlayer insulating film II3 and the etching stopper film ES2 to be coupled to the wiring IC1. The via plug VI1 is formed by the middle-first dual damascene method. Therefore, the via plug VI1 is formed integrally with the wiring IC2.

The etching stopper film ES3 is provided over the interlayer insulating film II3. The etching stopper film ES3 contains Si and C. In the present embodiment, the etching stopper film ES3, for example, includes SiCN or SiC. By using these materials, it becomes possible to suppress increase of a dielectric constant in the multilayer wiring structure, while securing a function as the etching stopper in etching the interlayer insulating film II4. A thickness of the etching stopper film ES3 is, for example, not less than 100 nm and not more than 150 nm. By employing such film thickness, it becomes possible to suppress increase of a dielectric constant in the multilayer wiring structure, while securing the function as the etching stopper in etching the interlayer insulating film II4.

The inorganic insulating film IN1 is provided over the etching stopper film ES3.

The inorganic insulating film IN1 does not contain C. In the present embodiment, the inorganic insulating film. IN1, for example, includes $SiO_2$, SiOF, or SiN. A film having good $O_2$ plasma ashing resistance can be achieved by using these materials. Therefore, it is possible to effectively suppress occurrence of damage in the etching stopper film ES3 when removing a resist film PR2 over the etching stopper film ES3.

In addition, it is preferable to use, for example, a material including the same type of element as the interlayer insulating film II4 as a material that configures the inorganic insulating film IN1. As a result of this, it is possible to suppress change of the characteristics of the wiring layer by introducing the inorganic insulating film IN1. In this case, manufacturing of the semiconductor device SM1 utilizing an existing manufacturing process can be achieved.

A thickness of the inorganic insulating film IN1 is, for example, not less than 30 nm and not more than 60 nm. Sufficient ashing resistance can be achieved in the inorganic insulating film IN1 by setting the thickness of the inorganic insulating film IN1 to be not less than the above-described lower limit. In addition, patterning becomes easy when the inorganic insulating film IN1 and the etching stopper film ES3 are patterned to form a hard mask by setting the thickness of the inorganic insulating film IN1 to be not more than the above-described upper limit. Therefore, ease of manufacturing the semiconductor device SM1 can be made well.

The thickness of the inorganic insulating film IN1 is, for example, smaller than that of the etching stopper film ES3. As a result of this, patterning can be easily performed when the inorganic insulating film IN1 and the etching stopper film ES3 are patterned to form the hard mask.

The interlayer insulating film II4 is provided over the inorganic insulating film IN1.

The interlayer insulating film II4 is formed, for example, so as to be in contact with the inorganic insulating film IN1. In this case, another layer does not intervene between the inorganic insulating film IN1 and the interlayer insulating film II4.

The interlayer insulating film II4, for example, includes $SiO_2$ or SiOF. In addition, the interlayer insulating film II4 may include a low-dielectric-constant film.

A thickness of the interlayer insulating film II4 is, for example, not less than 500 nm. In the present embodiment, the thickness of the interlayer insulating film II4 is, for example, not less than 10 times of the thickness of the inorganic insulating film IN1. Namely, the thickness of the inorganic insulating film IN1 is not more than one-tenth of the thickness of the interlayer insulating film II4. As described above, the inorganic insulating film IN1 is formed as a thin film, and thereby patterning can be easily performed when the inorganic insulating film IN1 and the etching stopper film ES3 are patterned to form the hard mask. In addition, it is possible to achieve the interlayer insulating film II4 having a thickness sufficient for forming wirings.

The wiring IC2 is provided in the interlayer insulating film II4 so as to penetrate it. The wiring IC2 is coupled to the via plug VI1.

In the present embodiment, a wiring groove WG1 in which the wiring IC2 is buried is provided extending from the interlayer insulating film II4 to the etching stopper film ES3 and the inorganic insulating film IN1. Namely, the wiring groove WG1 is configured by an opening provided in the interlayer insulating film II4, and openings provided in the etching stopper film ES3 and the inorganic insulating film IN1, respectively so as to overlap with the opening. In the present embodiment, the wiring IC2 is the damascene wiring buried in the interlayer insulating film II4.

The wiring IC2 and the via plug VI1, for example, include a barrier metal film BM1 and a conductive member CM1 in which the wiring groove WG1 and a via hole VH1 are buried. The barrier metal film BM1 is provided at a side surface and a bottom surface of the wiring groove WG1, and a side surface and a bottom surface of the via hole VH1. The conductive member CM1 is provided over the barrier metal film BM1, and fills the wiring groove WG1 and the via hole VH1. The barrier metal film BM1, for example, includes a stacked film of TiN and Ti, or a single-layer film of TiN. The conductive member CM1, for example, includes Cu.

An etching stopper film ES4 is provided over the interlayer insulating film II4. The etching stopper film ES4 is provided allover the interlayer insulating film. II4, for example, so as to cover the wiring IC2. The etching stopper film ES4, for example, includes SiCN or SiC.

An interlayer insulating film II5 is formed over the etching stopper film ES4. The interlayer insulating film II5, for example, includes $SiO_2$ or SiOF. In addition, the interlayer insulating film II5 may include a low-dielectric-constant film. In the present embodiment, the etching stopper film ES4 functions as an etching stopper when the interlayer insulating film II5 is etched.

It is to be noted that the multilayer wiring structure of the semiconductor device SM1 in the present embodiment is not limited to the one shown in FIG. 1. For example, a plurality of wiring layers may further be formed over the interlayer insulating film II5. In addition, the inorganic insulating film IN1 may be formed at a portion other than a portion shown in FIG. 1 of the multilayer wiring structure that configures the semiconductor device SM1, as long as it is located over the etching stopper film provided over the interlayer insulating film for burying the via plug that configures a dual damascene structure.

In addition, the plurality of inorganic insulating films IN1 may also be provided in the multilayer wiring structure that configures the semiconductor device SM1.

Next, there will be explained a method of manufacturing the semiconductor device SM1 according to the present embodiment.

FIGS. 2A to 5B are cross-sectional views showing the method of manufacturing the semiconductor device SM1 shown in FIG. 1. It is to be noted that FIGS. 2A to 5B are schematic views showing the method of manufacturing the semiconductor device SM1, and the method of manufacturing the semiconductor device SM1 is not limited to the one shown in FIGS. 2A to 5B. In FIGS. 2A to 5B are shown steps of manufacturing from a wiring layer including the wiring IC1 to a wiring layer including the wiring IC2.

In the present embodiment, the wiring IC2 and the via plug VI1 are formed by the middle-first dual damascene method.

First, as shown in FIG. 2A, the interlayer insulating film II2 is formed over the semiconductor substrate SB1. The interlayer insulating film II2 is formed, for example, by a CVD (Chemical Vapor Deposition) method. Next, the wiring IC1 is formed in the interlayer insulating film II2. The wiring IC1 is formed in the interlayer insulating film II2, for example, using a damascene method. As a result of this, a wiring layer including the wiring IC1 is formed over the semiconductor substrate SB1.

It is to be noted that for example, the transistor TR1 is provided at the semiconductor substrate SB1. In addition, for example, one or more wiring layers are formed between the semiconductor substrate SB1 and the interlayer insulating film II2. The wiring IC1 provided in the interlayer insulating film II2 is coupled to the transistor TR1, for example, through the contact plug CO1 and the like.

Next, the etching stopper film ES2 is formed over the interlayer insulating film II2. The etching stopper film ES2 is formed, for example, by the CVD method. Next, the interlayer insulating film II3 is formed over the etching stopper film ES2. The interlayer insulating film II3 is formed, for example, by the CVD method.

Figure 2B:
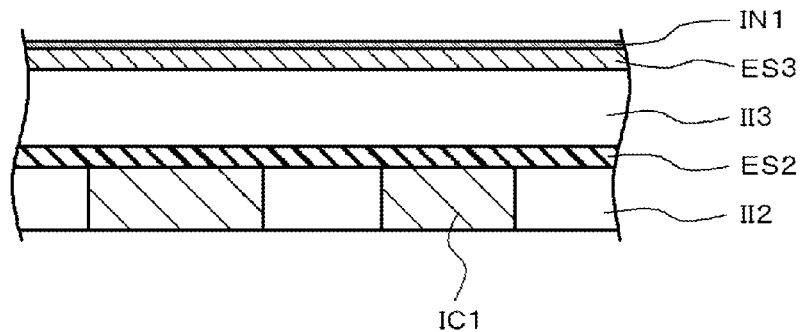

Next, as shown in FIG. 2B, the etching stopper film ES3 including Si and C is formed over the interlayer insulating film II3. The etching stopper film ES3 is formed, for example, by the CVD method. Next, the inorganic insulating film IN1 not containing C is formed over the etching stopper film ES3. The inorganic insulating film IN1 is formed, for example, by the CVD method.

Figure 3A:
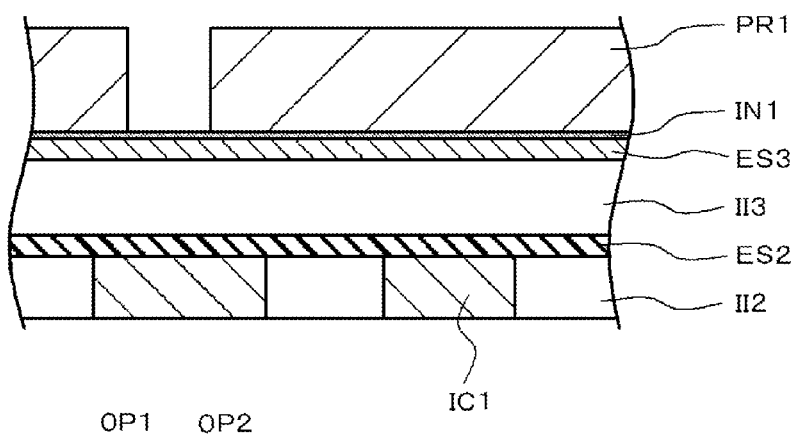
FIGS. 3A and 3B are cross-sectional views showing the method of manufacturing the semiconductor device shown in FIG. 1.

Next, as shown in FIG. 3A, a resist film PR1 is formed over the inorganic insulating film IN1. The resist film PR1 is formed, for example, by exposing and developing a resist film provided over the inorganic insulating film IN1.

In the resist film PR1 is provided an opening corresponding to an opening OP1 formed in the etching stopper film ES3 and an opening OP2 formed in the inorganic insulating film IN1 that will be mentioned later. The opening is provided, for example, so as to overlap with the wiring IC1 in a planar view.

When pattern shift or other defects occur in the resist film PR1, the resist film PR1 is formed again after once removed (hereinafter referred to as a rework step). In this rework step, the resist film PR1 is removed, for example, by $O_2$ plasma ashing.

According to the present embodiment, the inorganic insulating film IN1 having high $O_2$ plasma ashing resistance is provided over the etching stopper film ES3. Therefore, it is possible to suppress occurrence of damage in the etching stopper film ES3 by ashing in the rework step. Accordingly, also in a case of including the rework step, it becomes possible to suppress impairment of a function as the etching stopper in the etching stopper film ES3.

Figure 3B:
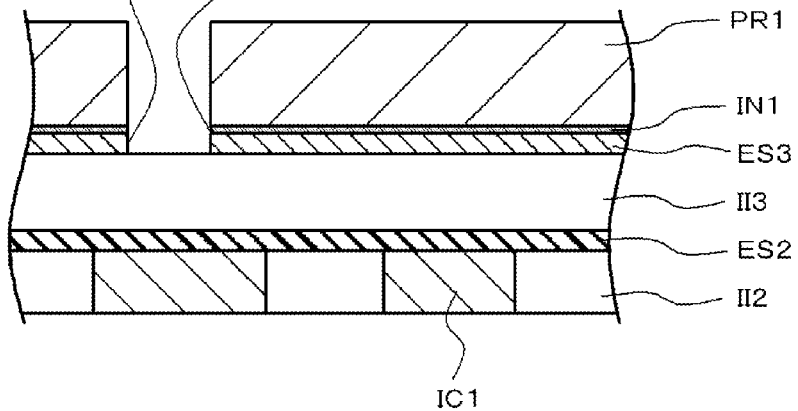

Next, as shown in FIG. 3B, the etching stopper film ES3 and the inorganic insulating film IN1 are selectively etched by using the resist film PR1 as a mask, the opening OP1 is formed in the etching stopper film ES3, and the opening OP2 that overlaps with the opening OP1 is formed in the inorganic insulating film IN1. The openings OP1 and OP2 are formed, for example, by dry etching. At this time, formation of the opening OP1 and formation of the opening OP2 are successively performed, for example, by dry etching using the same etching gas.

It is to be noted that the openings OP1 and OP2 are provided, for example, so as to overlap with the wiring IC1 in a planar view.

Next, the resist film PR1 is removed by $O_2$ plasma ashing. In the $O_2$ plasma ashing, the resist film. PR1 is reacted with oxygen gas made into plasma, and thereby the resist film PR1 is removed.

According to the present embodiment, the inorganic insulating film IN1 having high $O_2$ plasma ashing resistance is provided over the etching stopper film ES3. Therefore, it is possible to suppress occurrence of damage in the etching stopper film ES3 by ashing in the step of removing the resist film. PR1. Accordingly, it becomes possible to suppress the impairment of the function as the etching stopper in the etching stopper film ES3 due to removal of the resist film PR1 for patterning the etching stopper film ES3.

Figure 4A:
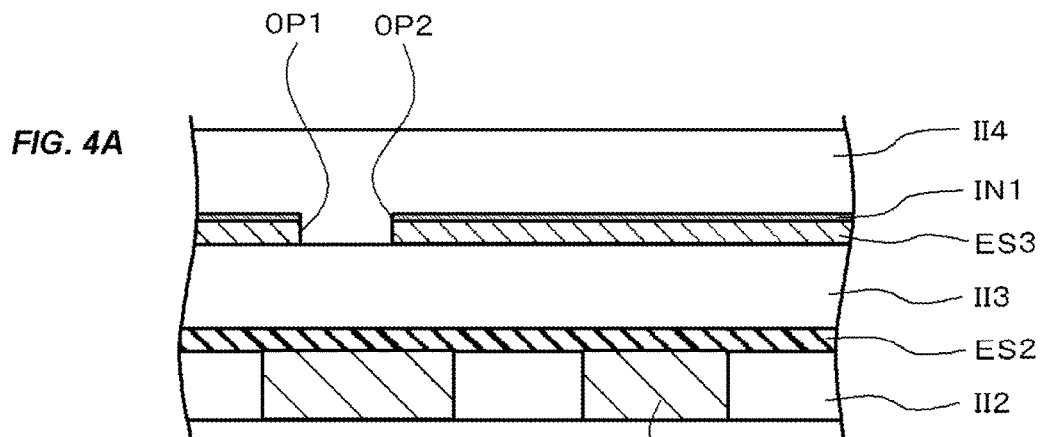
FIGS. 4A and 4B are cross-sectional views showing the method of manufacturing the semiconductor device shown in FIG. 1.

Next, as shown in FIG. 4A, the interlayer insulating film II4 is formed over the inorganic insulating film IN1. The interlayer insulating film II4 is formed, for example, by the CVD method.

As described above, various steps including patterning and the like are performed during a period until the interlayer insulating film II4 is formed after the inorganic insulating film IN1 is formed. As a result of this, a surface of the inorganic insulating film IN1 is reformed. Therefore, even though the inorganic insulating film IN1 and the interlayer insulating film II4 are formed of the same type of material, a boundary surface thereof remains.

Figure 4B:
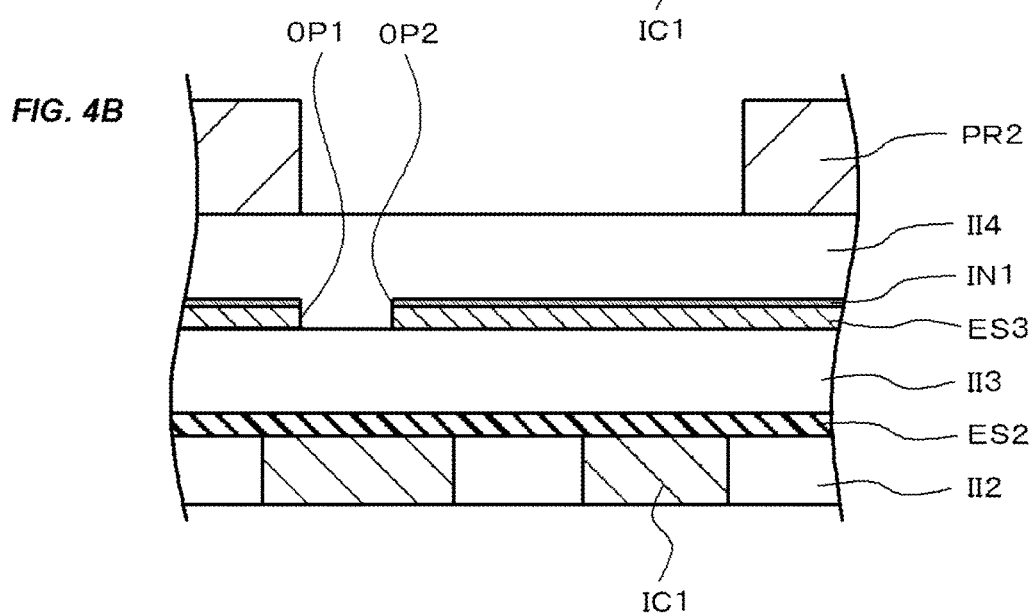

Next, as shown in FIG. 4B, the resist film PR2 is formed over the interlayer insulating film II4. The resist film PR2 is formed, for example, by exposing and developing a resist film provided over the interlayer insulating film II4. The opening corresponding to the wiring groove WG1, which will be mentioned later, is provided in the resist film PR2.

Next, as shown in FIG. 5A, the interlayer insulating film II4 is etched to form the wiring groove WG1 coupled to the opening OP2, and a portion located under the opening OP1 of the interlayer insulating film II3 is etched to form the via hole VH1. Formation of the wiring groove WG1 and formation of the via hole VH1 are, for example, performed as follows.

First, the interlayer insulating film II4 is etched by using the resist film PR2 as a mask. Etching of the interlayer insulating film II4 is performed, for example, by dry etching. As a result of this, the wiring groove WG1 coupled to the opening OP2 is formed. At this time, the etching stopper film ES3 functions as an etching stopper.

Next, the interlayer insulating film II3 is etched by using the etching stopper film ES3 as a mask. Etching of the interlayer insulating film II3 is performed, for example, by dry etching. As a result of this, the via hole VH1 located under the opening OP1 is formed. At this time, the etching stopper film ES3 functions as a hard mask. It is to be noted that a portion that is not covered with the resist film PR2 of the etching stopper film ES3 and the inorganic insulating film IN1 is, for example, removed simultaneously with the formation of the via hole VH1. In this case, the wiring groove WG1 is formed penetrating the etching stopper film ES3, the inorganic insulating film IN1, and the interlayer insulating film II4. It is to be noted that after formation of the via hole VH1, the portion that is not covered with the resist film PR2 of the etching stopper film ES3 and the inorganic insulating film IN1 may remain.

In the present embodiment, etching for forming the wiring groove WG1 and etching for forming the via hole VH1 are successively performed, for example, by dry etching using the same etching gas.

Next, as shown in FIG. 5B, the via plug VI1 and the wiring IC2 are formed. The via plug VI1 and the wiring IC2 are, for example, formed as follows.

First, a metal film that configures the barrier metal film BM1 and a metal film that configures the conductive member CM1 are stacked over the side surface and the bottom surface of the via hole VH1, over the side surface and the bottom surface of the wiring groove WG1, and over the interlayer insulating film II4. Next, surplus metal films that have been provided at portions other than the via hole VH1 and the wiring groove WG1 are removed, for example, by CMP (Chemical Mechanical Polishing). As a result of this, the via plug VI1 and the wiring IC2 that include the barrier metal film BM1 and the conductive member CM1 are formed.

Subsequently, the multilayer wiring structure including the interlayer insulating film II5 is formed over the interlayer insulating film II4. As a result of this, the semiconductor device SM1 shown in FIG. 1 can be obtained.

Next, effects of the present embodiment will be explained.

According to the present embodiment, the inorganic insulating film IN1 is formed over the etching stopper film ES3. The inorganic insulating film IN1 is the film not containing C, and has high resistance to $O_2$ plasma ashing. Therefore, it is possible to prevent the etching stopper film ES3 from being damaged when removing, by ashing, the resist film PR1, which is used when the etching stopper film ES3 is patterned. Accordingly, it becomes possible to suppress the impairment of the function as the etching stopper in the etching stopper film ES3, and to improve manufacturing stability of a semiconductor device.

Figure 6A:
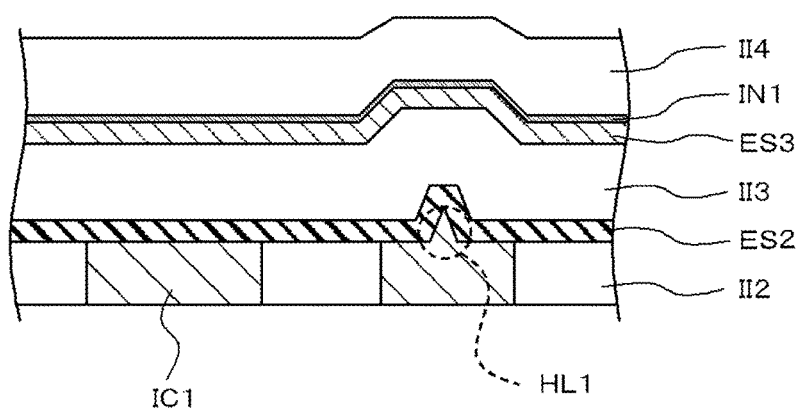
FIGS. 6A and 6B are cross-sectional views for explaining effects of the present embodiment.
Figure 6B:
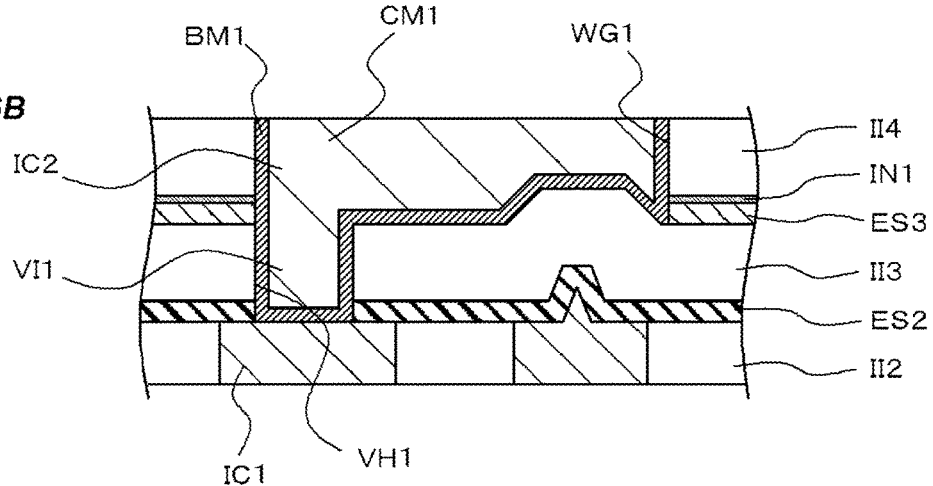

FIGS. 6A and 6B are views for explaining the effects of the present embodiment.

For example, a hillock HL1 may be generated over the wiring IC1. The hillock HL1 is a projection having occurred over the wiring IC1. In this case, unevenness is generated at the etching stopper film ES3 in a portion located over the hillock HL1. There is a possibility that a portion with a thin film thickness occurs at the etching stopper film ES3 due to this unevenness. As described above, when the portion with the thin film thickness occurs at the etching stopper film ES3, such problems as the etching stopper film ES3 has a hole due to damage by ashing may occur.

Such problems arise, for example, similarly in a case where a foreign matter has occurred over the wiring IC1.

According to the present embodiment, the inorganic insulating film IN1 is provided over the etching stopper film ES3. Therefore, it is possible to prevent the etching stopper film ES3 from being damaged when removing, by ashing, the resist film PR1, which is used when the etching stopper film. ES3 is patterned. Accordingly, also in the case where the hillock HL1 is generated over the wiring IC1 as shown in FIG. 6A, a good damascene wiring can be formed as shown in FIG. 6B.

Hereinbefore, although the invention made by the present inventor has been specifically explained based on the present embodiment, the present invention is not limited to the above-described embodiment, and it is needless to say that various changes can be made without departing from the spirit of the present invention.

What is claimed is:

1. A method of manufacturing a semiconductor device, comprising the steps of:
    forming a first interlayer insulating film over a semiconductor substrate;
    forming an etching stopper film containing Si and C over the first interlayer insulating film;
    forming an inorganic insulating film not containing C over the etching stopper film;
    forming a resist film over the inorganic insulating film;
    selectively etching the etching stopper film and the inorganic insulating film so as to expose an upper surface of the first interlayer insulating film by using the resist film as a mask to form a first opening in the etching stopper film and to form a second opening that overlaps with the first opening in the inorganic insulating film;
    removing the resist film by $O_2$ plasma ashing;
    forming a second interlayer insulating film over the inorganic insulating film and in contact with the upper surface of the first interlayer insulating film; and
    etching the second interlayer insulating film to form a wiring groove that is coupled to the second opening, and etching a portion located under the first opening of the first interlayer insulating film to form a via hole.

2. The method of manufacturing a semiconductor device according to claim 1, comprising the step of before the step of forming the first interlayer insulating film, forming a wiring layer including a first wiring over the semiconductor substrate,
    wherein in the step of forming the first opening and forming the second opening, the first opening and the second opening are provided so as to overlap with the wiring in a planar view.

3. The method of manufacturing a semiconductor device according to claim 1, wherein the etching stopper film includes SiCN or SiC.

4. The method of manufacturing a semiconductor device according to claim 1, wherein the inorganic insulating film includes $SiO_2$, SiOF, or SiN.

5. The method of manufacturing a semiconductor device according to claim 1, wherein a thickness of the inorganic insulating film is smaller than that of the etching stopper film.

6. The method of manufacturing a semiconductor device according to claim 1, wherein the thickness of the inorganic insulating film is not more than one-tenth of a thickness of the second interlayer insulating film.

* * * * *